United States Patent

DiFoggio

(10) Patent No.: US 10,326,032 B2
(45) Date of Patent: Jun. 18, 2019

(54) GRAPHENE TUNNELING PHOTODETECTORS FOR HIGH-TEMPERATURE DOWNHOLE USE

(71) Applicant: Rocco DiFoggio, Houston, TX (US)

(72) Inventor: Rocco DiFoggio, Houston, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 130 days.

(21) Appl. No.: 15/150,808

(22) Filed: May 10, 2016

(65) Prior Publication Data

US 2017/0329044 A1    Nov. 16, 2017

(51) Int. Cl.
*E21B 47/10* (2012.01)
*E21B 49/08* (2006.01)
*H01L 31/028* (2006.01)
*H01L 31/113* (2006.01)

(52) U.S. Cl.
CPC .......... *H01L 31/028* (2013.01); *E21B 47/102* (2013.01); *E21B 49/081* (2013.01); *H01L 31/113* (2013.01); *E21B 2049/085* (2013.01)

(58) Field of Classification Search
CPC ....................................................... G01V 8/10
See application file for complete search history.

(56) References Cited

U.S. PATENT DOCUMENTS

| | | | |
|---|---|---|---|
| 5,659,133 A | 8/1997 | Sims et al. | |
| 6,326,639 B1 * | 12/2001 | Schneider | B82Y 20/00 257/17 |
| 6,531,703 B1 | 3/2003 | Tavkhelidze | |
| 7,084,392 B2 | 8/2006 | DiFoggio et al. | |
| 7,173,239 B2 | 2/2007 | DiFoggio et al. | |
| 7,423,258 B2 | 9/2008 | DiFoggio et al. | |
| 8,068,226 B2 | 11/2011 | Csutak | |
| 8,604,462 B2 | 12/2013 | Kim | |
| 9,263,607 B2 | 2/2016 | Yoo et al. | |
| 9,273,278 B2 | 3/2016 | Lee et al. | |
| 2006/0042792 A1 * | 3/2006 | Connell | E21B 23/002 166/254.2 |
| 2006/0175547 A1 | 8/2006 | DiFoggio et al. | |
| 2006/0213660 A1 | 9/2006 | DiFoggio et al. | |
| 2006/0213669 A1 | 9/2006 | Shipley et al. | |
| 2008/0061225 A1 | 3/2008 | Orban et al. | |
| 2010/0187413 A1 * | 7/2010 | DiFoggio | G01V 8/02 250/269.1 |

(Continued)

FOREIGN PATENT DOCUMENTS

CN    104500042 A * 4/2015    ............. E21B 47/06

OTHER PUBLICATIONS

English Translation of CN 104500042 A from Google Patents Feb. 1, 2018.*

(Continued)

*Primary Examiner* — David P Porta
*Assistant Examiner* — Jeremy S Valentiner
(74) *Attorney, Agent, or Firm* — Cantor Colburn LLP

(57) ABSTRACT

Methods and systems including a photodetector of a downhole tool for performing downhole operations are provided herein. The photodetector includes a housing configured along a carrier disposed downhole within a borehole and a graphene tunneling photodetector located within the housing configured to perform a downhole operation.

18 Claims, 3 Drawing Sheets

(56) References Cited

U.S. PATENT DOCUMENTS

2010/0282971 A1* 11/2010 Simonetti ................. G01T 1/20
                                                          250/361 R
2012/0055243 A1    3/2012 DiFoggio et al.
2013/0026442 A1*   1/2013 Kim ...................... H01L 31/028
                                                          257/9
2015/0357485 A1   12/2015 Choi et al.
2017/0030186 A1*   2/2017 Rodgers ............... G01V 11/002

OTHER PUBLICATIONS

Liu, et al. "Graphene photodetectors with ultra-broadband and high responsivity at room temperature"; Nature Nanotechnology, Mar. 16, 2014; pp. 1-6.

"Electrons incident on an energy step: E < Uo", Accessed via the internet at [http://tuttle.merc.iastate.edu/ee439/topics/tunneling.pdf], published Dec. 22, 2012; 14 pages.

Buscema et al. "Photocurrent generation with two-dimensional van der Waals semi-conductors", Chemical Society Reviews, Apr. 13, 2015; 32 pages.

Fang et al. "Photogating in Low Dimensional Photodetectors", Adv. Sci., 4, 2017; 17 pages.

International Search Report, International Application No. PCT/US2017/030994, dated Jul. 25, 2017, Korean Intellectual Property Office; International Search Report 4 pages.

International Written Opinion, International Application No. PCT/US2017/030994, dated Jul. 25, 2017, Korean Intellectual Property Office; International Written Opinion 9 pages.

Konstantatos et al. "Hybrid graphene-quantum dot phototransistors with ultrahigh gain", Barcelona, Spain, 2011; 18 pages.

\* cited by examiner

GRAPHENE TUNNELING PHOTODETECTORS FOR HIGH-TEMPERATURE DOWNHOLE USE

BACKGROUND

1. Field of the Invention

The present invention relates generally to the field of downhole sampling and in particular to the downhole analysis of fluids and gases containing hydrocarbons using electromagnetic radiation (light) and a broad spectrum optical sensor/detector for measurement and estimation of properties of fluid and gas samples and properties of the reservoir from which a fluid or gas is taken, prior to, during, or after capture of the fluid or gas in a sample chamber.

2. Description of the Related Art

In wellbore exploration, drilling mud such as oil-based mud and synthetic-based mud types are used. The filtrates from these mud types generally invade the formation through the borehole wall to an extent, meaning that these filtrates must be removed, as much as they can be removed, from the formation by pumping in order to access the formation fluids after filtrate has been pumped out. Open-hole sampling is an effective way to acquire representative reservoir fluids. Sample acquisition allows determination of critical information for assessing the economic value of reservoirs. In addition, optimal production strategies can be designed to handle complex fluids that are detected. In open-hole sampling, initially, the flow from the formation contains considerable filtrate, but as this filtrate is drained from the formation, the flow increasingly becomes richer in formation fluid. That is, the sample flow from the formation contains a higher percentage of formation fluid as pumping continues.

It is well known that fluid being pumped from a wellbore undergoes a clean-up process in which the purity of the sample increases over time as filtrate is gradually removed from the formation and less filtrate appears in the sample. When extracting fluids from a formation, it is desirable to quantify the cleanup progress, that is, the degree of contamination from filtrate in real-time. If it is known that if there is too much filtrate contamination in the sample (for example, more than about 5% or 10%), then there may be no reason to collect the formation fluid sample into a sample tank until the contamination level drops to an acceptable level. Thus, there is a need for systems, processes, and/or methods for directly analyzing a fluid sample and determining percentage of filtrate contamination in a sample, downhole and/or in situ.

SUMMARY

Disclosed herein is a photodetector of a downhole tool for performing a downhole operation. The photodetector includes a housing configured along a carrier disposed downhole within a borehole and a graphene tunneling photodetector located within the housing configured to perform a downhole operation.

Further, disclosed herein, is a method for performing a downhole operation using a photodetector. The method includes conveying a housing downhole along a carrier and performing a downhole operation with a graphene tunneling photodetector.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings, wherein like elements are numbered alike, in which:

DETAILED DESCRIPTION

Figure 1:
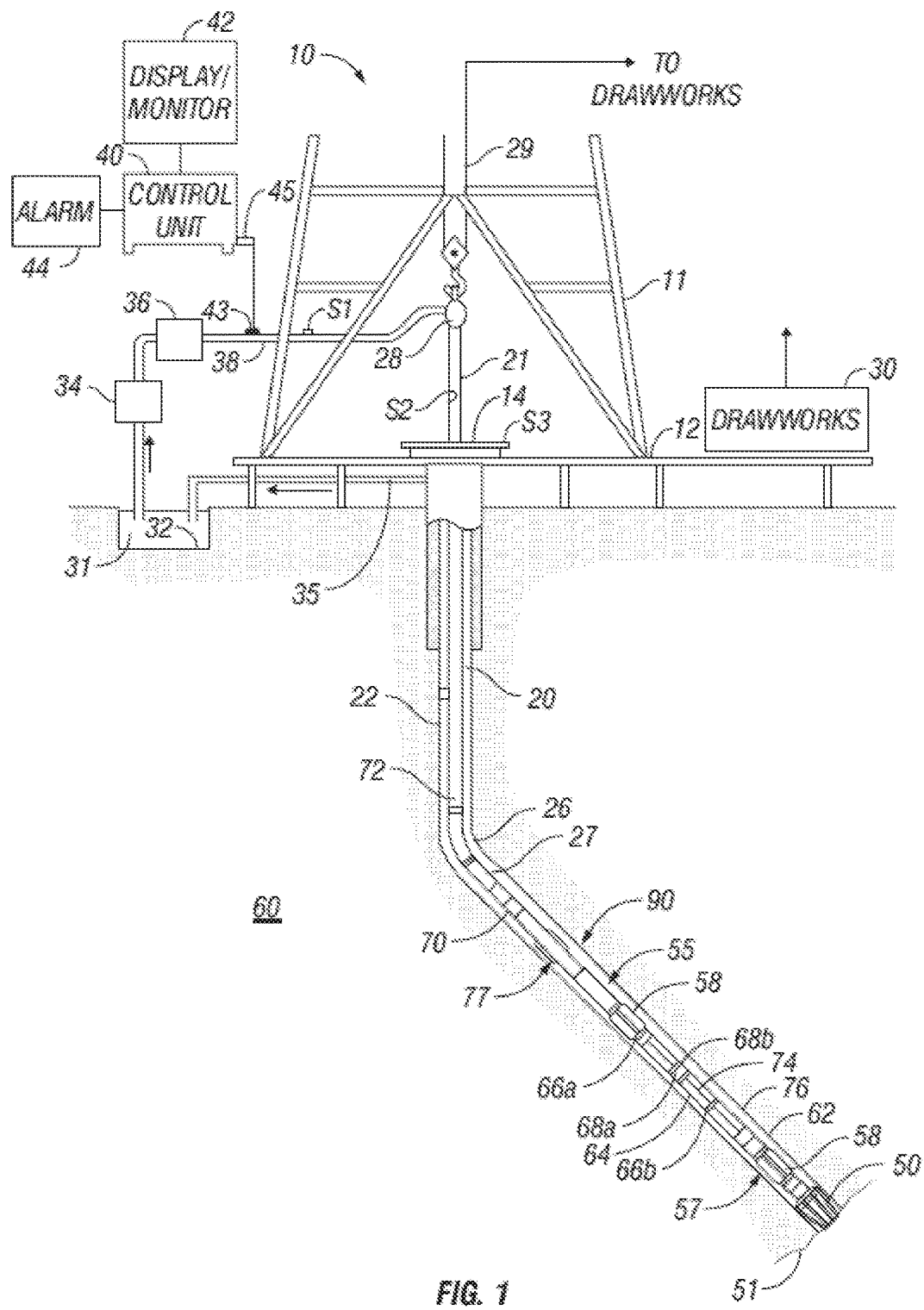
FIG. 1 is a schematic illustration of a drilling system that may employ one or more embodiments described herein.

Disclosed are methods and apparatus for, downhole photodetectors and/or spectrometers that employ graphene tunneling photodetectors to enable spectral measurements from which estimates of physical and/or chemical properties of a downhole fluid can be made. It should be appreciated by those of skill in the art that graphene tunneling photodetectors as provided herein should not be confused with non-tunneling graphene photodetectors, which must be operated at cryogenic temperatures. Graphene tunneling photodetectors, as provided in accordance with some embodiments herein, can be configured to measure at least visible, near-infrared, and/or mid-infrared light downhole.

Unlike other types of photodetectors, graphene tunneling photodetectors are based on a different principle. Therefore, graphene tunneling photodetectors do not have the problem of a huge drop in shunt resistance (increased leakage) at high downhole temperatures that occurs for quantum photodetectors such as Silicon, GaAs, InGaAs, or GaInAsSb/AlGaAsSb photodiodes. For example, the shunt resistance of a typical Silicon photodiode (which is one of the shorter wavelength photodiodes) can drop by a factor of more than one billion with increasing temperature from 0° C. to 160° C. A standard photodiode's temperature problem gets worse with increasing photodiode wavelength such as for mid-infrared photodiodes for which a band gap is the smallest and a thermally-induced excitation of electrons from the valence to the conduction band is greatest, which masks the desired signal of photon-induced excitation of electrons from the valence to the conduction band whenever the photodiode is operated at high temperatures. Therefore, the high-temperature benefits of graphene tunneling photodetectors are most pronounced for mid-infrared and far infrared light detection. Graphene tunneling photodetectors can provide high sensitivity photodetection, which is comparable to that of standard photodiodes, but which, unlike standard photodiodes, is not adversely affected by the high temperatures that can be experienced in downhole operations. As such, a detected signal is not affected by the temperatures of the surroundings or by the detector's own temperature.

Although thermal photodetectors, such as pyroelectric photodetectors, also have little degradation in performance at high downhole temperatures, signal strength of such photodetectors, at both low and high temperatures, in amperes-per-watt of incident photons is very weak to start with and approximately one million times smaller than the corresponding signal of a graphene tunneling photodetector. For expected light intensities, a pyroelectric signal is expected to be on the order of 100 femtoamps. In contrast, a graphene tunneling photodetector combines high temperature performance with high signal strength, which is ideal for use in downhole spectrometers, refractometers, or other downhole optical sensing applications. Also, graphene tunneling photodetectors are sensitive to a much wider wavelength range than are standard band gap photodiodes.

FIG. 1 shows a schematic diagram of a drilling system 10 that includes a carrier 20 (e.g., a drill string) having a bottomhole assembly (BHA) 90 conveyed in a borehole 26 penetrating an earth formation 60. The drilling system 10 includes a conventional derrick 11 erected on a floor 12 that supports a rotary table 14 that is rotated by a prime mover, such as an electric motor (not shown), at a desired rotational speed. The carrier 20 includes a drilling tubular, such as a drill pipe 22, extending downward from the rotary table 14 into the borehole 26. A drill bit 50, attached to the end of the BHA 90, disintegrates the geological formations when it is rotated to drill the borehole 26. The carrier 20 is coupled to a drawworks 30 via a kelly joint 21, swivel 28 and line 29 through a pulley 23. During the drilling operations, the drawworks 30 is operated to control the weight on bit, which affects the rate of penetration. The operation of the drawworks 30 is well known in the art and is thus not described in detail herein.

During drilling operations a suitable drilling fluid 31 (also referred to as the "mud") from a source or mud pit 32 is circulated under pressure through the carrier 20 by a mud pump 34. The drilling fluid 31 passes into the carrier 20 via a desurger 36, fluid line 38 and the kelly joint 21. The drilling fluid 31 is discharged at the borehole bottom 51 through an opening in the drill bit 50. The drilling fluid 31 circulates uphole through the annular space 27 between the carrier 20 and the borehole 26 and returns to the mud pit 32 via a return line 35. A sensor 51 in the fluid line 38 provides information about the fluid flow rate. A surface torque sensor S2 and a sensor S3 associated with the carrier 20 respectively provide information about the torque and the rotational speed of the drill string. Additionally, one or more sensors (not shown) associated with line 29 are used to provide the hook load of the carrier 20 and about other desired parameters relating to the drilling of the borehole 26. The system may further include one or more downhole sensors 70 located on the carrier 20 and/or the BHA 90.

In some applications the drill bit 50 is rotated by only rotating the drill pipe 22. However, in other applications, a drilling motor 55 (mud motor) disposed in the BHA 90 is used to rotate the drill bit 50 and/or to superimpose or supplement the rotation of the carrier 20. In either case, the rate of penetration (ROP) of the drill bit 50 into the borehole 26 for a given formation and a drilling assembly largely depends upon the weight on bit and the drill bit rotational speed. In one aspect of the embodiment of FIG. 1, the mud motor 55 is coupled to the drill bit 50 via a drive shaft (not shown) disposed in a bearing assembly 57. The mud motor 55 rotates the drill bit 50 when the drilling fluid 31 passes through the mud motor 55 under pressure. The bearing assembly 57 supports the radial and axial forces of the drill bit 50, the downthrust of the drilling motor and the reactive upward loading from the applied weight on bit. Stabilizers 58 coupled to the bearing assembly 57 and other suitable locations act as centralizers for the lowermost portion of the mud motor assembly and other such suitable locations.

A surface control unit 40 receives signals from the downhole sensors 70 and devices via a sensor 43 placed in the fluid line 38 as well as from sensors 51, S2, S3, hook load sensors and any other sensors used in the system and processes such signals according to programmed instructions provided to the surface control unit 40. The surface control unit 40 displays desired drilling parameters and other information on a display/monitor 42 for use by an operator at the rig site to control the drilling operations. The surface control unit 40 contains a computer, memory for storing data, computer programs, models and algorithms accessible to a processor in the computer, a recorder, such as tape unit, memory unit, etc. for recording data and other peripherals. The surface control unit 40 also may include simulation models for use by the computer to processes data according to programmed instructions. The control unit responds to user commands entered through a suitable device, such as a keyboard. The control unit 40 is adapted to activate alarms 44 when certain unsafe or undesirable operating conditions occur.

The BHA 90 also contains other sensors and devices or tools for providing a variety of measurements relating to the formation surrounding the borehole and for drilling the borehole 26 along a desired path. Such devices may include a device for measuring the formation resistivity near and/or in front of the drill bit, a gamma ray device for measuring the formation gamma ray intensity and devices for determining the inclination, azimuth and position of the drill string. A formation resistivity tool 64, made according an embodiment described herein may be coupled at any suitable location, including above a lower kick-off subassembly 62, for estimating or determining the resistivity of the formation near or in front of the drill bit 50 or at other suitable locations. An inclinometer 74 and a gamma ray device 76 may be suitably placed for respectively determining the inclination of the BHA and the formation gamma ray intensity. Any suitable inclinometer and gamma ray device may be utilized. In addition, an azimuth device (not shown), such as a magnetometer or a gyroscopic device, may be utilized to determine the drill string azimuth. Such devices are known in the art and therefore are not described in detail herein. In the above-described exemplary configuration, the mud motor 55 transfers power to the drill bit 50 via a hollow shaft that also enables the drilling fluid to pass from the mud motor 55 to the drill bit 50. In an alternative embodiment of the carrier 20, the mud motor 55 may be coupled below the resistivity tool 64 or at any other suitable place.

Still referring to FIG. 1, other logging-while-drilling (LWD) devices (generally denoted herein by numeral 77), such as devices for measuring formation porosity, permeability, density, rock properties, fluid properties, etc. may be placed at suitable locations in the BHA 90 for providing information useful for evaluating the subsurface formations along borehole 26. Such devices may include, but are not limited to, acoustic tools, nuclear tools, nuclear magnetic resonance tools and formation testing and sampling tools.

The above-noted devices transmit data to a downhole telemetry system 72, which in turn transmits the received data uphole to the surface control unit 40. The downhole telemetry system 72 also receives signals and data from the surface control unit 40 and transmits such received signals and data to the appropriate downhole devices. In one aspect, a mud pulse telemetry system may be used to communicate data between the downhole sensors 70 and devices and the surface equipment during drilling operations. A transducer 43 placed in the fluid line 38, e.g., a mud supply line, detects the mud pulses responsive to the data transmitted by the downhole telemetry 72. Transducer 43 generates electrical signals in response to the mud pressure variations and transmits such signals via a conductor 45 to the surface control unit 40. In other aspects, any other suitable telemetry system may be used for two-way data communication between the surface and the BHA 90, including but not limited to, an acoustic telemetry system, an electro-magnetic telemetry system, a wireless telemetry system that may utilize repeaters in the drill string or the wellbore and a wired pipe. The wired pipe may be made up by joining drill pipe sections, wherein each pipe section includes a data communication link that runs along the pipe. The data connection between the pipe sections may be made by any suitable method, including but not limited to, hard electrical or optical connections, induction, capacitive or resonant coupling methods. In case a coiled-tubing is used as the drill pipe 22, the data communication link may be run along a side of the coiled-tubing.

The drilling system described thus far relates to those drilling systems that utilize a drill pipe to conveying the BHA 90 into the borehole 26, wherein the weight on bit is controlled from the surface, typically by controlling the operation of the drawworks. However, a large number of the current drilling systems, especially for drilling highly deviated and horizontal wellbores, utilize coiled-tubing for conveying the drilling assembly downhole. In such application a thruster is sometimes deployed in the drill string to provide the desired force on the drill bit. Also, when coiled-tubing is utilized, the tubing is not rotated by a rotary table but instead it is injected into the wellbore by a suitable injector while the downhole motor, such as mud motor 55, rotates the drill bit 50. For offshore drilling, an offshore rig or a vessel is used to support the drilling equipment, including the drill string.

Still referring to FIG. 1, a resistivity tool 64 may be provided that includes, for example, a plurality of antennas including, for example, transmitters 66a or 66b or and receivers 68a or 68b. Resistivity can be one formation property that is of interest in making drilling decisions. Those of skill in the art will appreciate that other formation property tools can be employed with or in place of the resistivity tool 64.

In various configurations, a BHA can include one or more sensors and/or detectors configured to investigate one or more properties of fluids and/or solids located downhole. For example, a BHA can be configured with a photodetector that is configured to monitor and/or measure one or more properties of a fluid that is in proximity to the BHA. In some embodiments, a fluid sample can be collected and drawn into the BHA or a component thereof (or a tool located on the carrier) and the photodetector can measure one or more characteristics of the fluid. From the measurement(s) various information and/or data can be extracted about the fluid and decisions based thereon can be made.

Advantageously, as provided herein, graphene tunneling photodetectors can provide little or no temperature dependence of signal strength or of signal-to-noise ratio at high downhole temperatures, can provide broad spectrum response(s), and/or can enable a high sensitivity to light so that the graphene tunneling photodetectors can be used effectively downhole for ultraviolet, visible, near-infrared, mid-infrared, and/or far-infrared light detection at high downhole temperatures.

Figure 2:
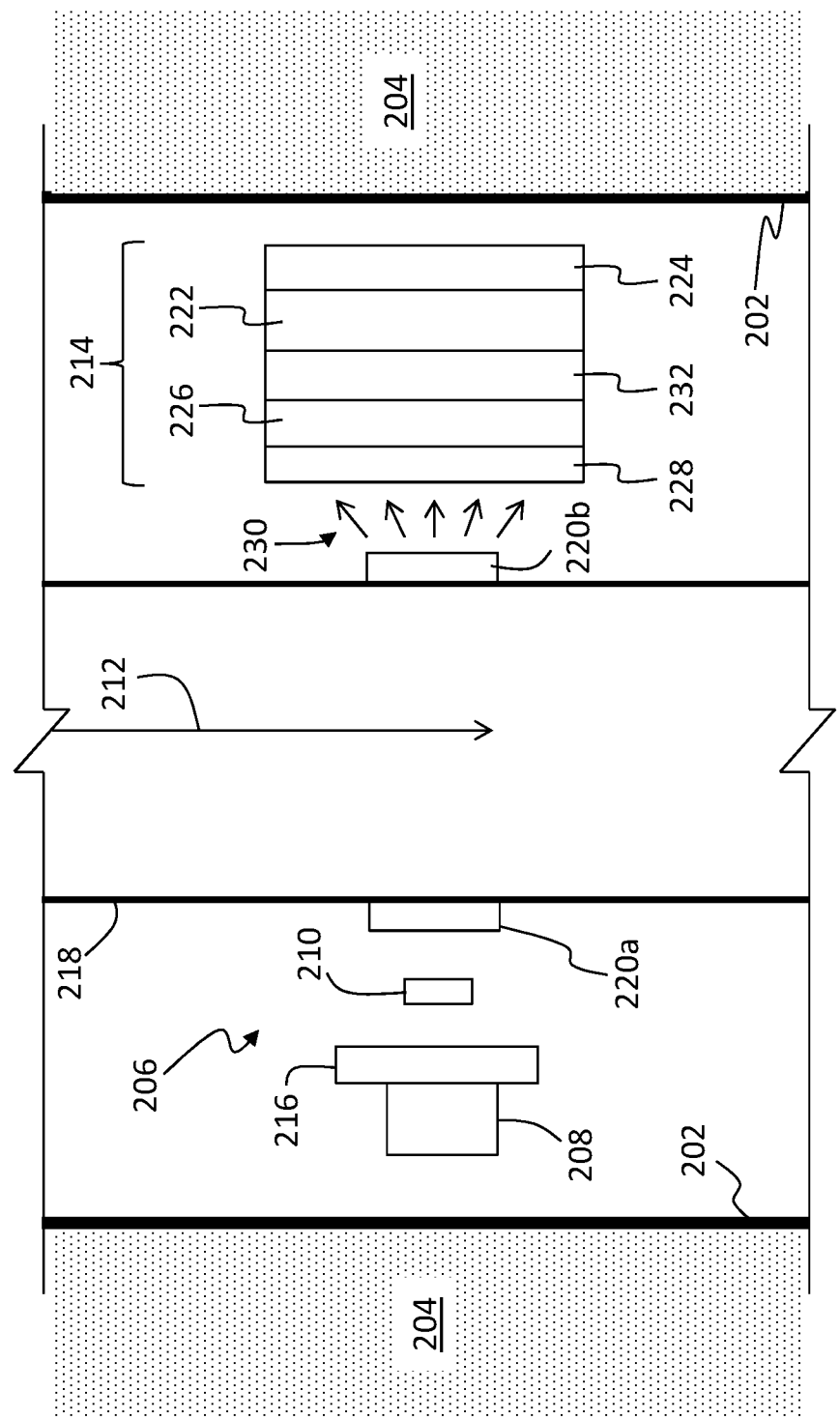
FIG. 2 is a schematic illustration of a sampling tool in accordance with an embodiment of the present disclosure.

Turning now to FIG. 2, a schematic of a non-limiting example of a sampling tool 200 is shown. The sampling tool 200 can be configured as part of a BHA or other downhole tool or component. The sampling tool 200 includes a housing 202 that fluidly separates the inside of the sampling tool 200 and a borehole area 204 that is exterior to the sampling tool 200. The housing 202 can be part of the BHA, a carrier, or other downhole tool or component (not shown).

Within the sampling tool 200 is a photodetector 206. The photodetector 206 includes a light source 208, such as a broad spectrum light source which can be a steady state light source or a modulated or pulsed light source. In the case of a steady state light source a light modulator 210 can be configured within the photodetector 206. The modulator 210 can be any suitable device which can vary an intensity of the light source 208, including but not limited to an electronic pulser circuit, as known in the art, that can vary the intensity of the light source 208. In some embodiments, the light modulator 210 can be configured with or as an electromechanical chopper that is configured to interrupt a path light from the light source 208 to a downhole fluid 212. The modulator 210 is provided to modulate the intensity of light from the light source 208 that impinges on the downhole fluid 212 and a detector 214. A reflector or collimator 216 can be provided to focus and/or concentrate light from the light source 208. A chamber, channel, or conduit 218 is provided for presentation of the downhole fluid 212 for exposure of the downhole fluid 212 to light from the light source 208. An optical window 220a, 220b is provided, through which the downhole fluid 212 is exposed to the light. For purposes of the present application, the term "fluid" includes liquids, gases, suspended solids, and/or combinations thereof.

The detector 214, in accordance with embodiments of the present disclosure, can be configured as a graphene tunneling photodetector. The detector 214 can include a spectrometer 222 and a processor 224 that are provided for analyzing signals received at a graphene tunneling sensor portion 226 of the detector 214 to determine a property of the downhole fluid 212 while located downhole. One or more filters 228 can be provided, as shown, and interposed between radiating light 230 passing through the downhole fluid 212 and the graphene tunneling sensor portion 226. In some embodiments, an optional amplifier 232 can be provided to amplify a signal received by the graphene tunneling sensor portion 226. In some embodiments, the processor 224 can include memory or other data storage and/or application media. The processor 224 can include programs that, in some embodiments, implement soft modeling techniques for applying a chemometric equation, neural network, and/or other soft modeling programs to the measurements of light detected by the graphene tunneling sensor portion 226 to estimate physical and/or chemical properties of the downhole fluid 212. Output of the spectrometer 222 and/or the processor 224 can be input to various soft modeling programs, neural networks, and/or chemometric equations to estimate properties of the downhole fluid 212. A graphene tunneling spectrometer, as provided herein, can enable a downhole sampling tool perform spectroscopy downhole during and/or prior to sampling, after sampling, and/or at the surface.

In one non-limiting the light source 208 can be a white light source (e.g., tungsten light bulb) that emits light toward the downhole fluid 212 (e.g., a sample). The collimator 216 may be configured as a collimating lens device that is positioned between the white light source and the sample and collimates the white light. The collimated light is incident, generally perpendicular, to the first optical window 220a, which can be a sapphire window. A second sapphire window 220b lies generally perpendicular to the collimated beam of light that passes through the two optical windows 220a, 220b. The two optical windows 220a, 220b are separated by the conduit or chamber 218 enabling a sample of downhole fluid 212 to flow between the two optical windows 220a, 220b. Reflected and fluoresced light can be used to determine properties of the downhole fluid 212 as received at the graphene tunneling sensor portion 226. In some embodiments, the sampling tool 200 can be fitted with a UV light source, which can be turned on when the light source 208 is turned off. The UV light source can include one or more UV bulbs, an UV LED, or an array of small UV LEDs.

Advantageously, employing a graphene tunneling sensor portion within a photodetector enables detection of multiple and/or various wavelengths of light without performance degradation with increasing temperature. That is, embodiments of the present disclosure enable downhole photodetectors with little to no temperature dependence, broad spectrum response, and high light sensitivity.

Figure 3:
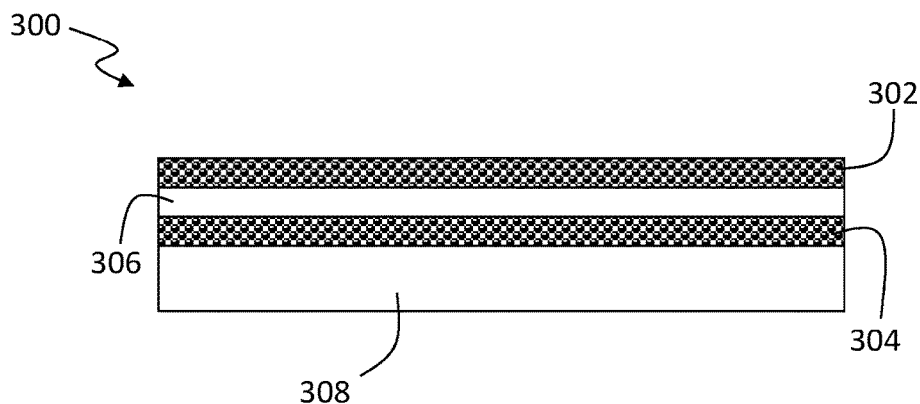
FIG. 3 is a schematic illustration of a graphene tunneling sensor portion in accordance with an embodiment of the present disclosure.

A graphene tunneling photodetector for downhole measurements and sampling, as provided herein, can make measurements of a downhole fluid through the generation of a photocurrent that results from tunneling of electrons through a barrier disposed between a top and a bottom layer of graphene. For example, referring to FIG. 3, graphene tunneling sensor portion 300 in accordance with a non-limiting embodiment of the present disclosure is shown. The graphene tunneling sensor portion 300 includes a first layer 302 that can operate as a top layer or gate and a second layer 304 that can operate as a bottom layer or channel of a phototransistor. Located between the first layer 302 and the second layer 304 is a barrier layer 306. As shown, the first layer 302, the second layer 304, and the barrier layer 306 can be positioned over a substrate 308.

In one non-limiting embodiment, the substrate 308 can be a silicon/silicon-dioxide substrate. The first layer 302 and the second layer 304 can each be graphene layers that are formed and constructed as graphene films. Further, in one non-limiting embodiment, the barrier layer 306 can be formed of tantalum pentoxide (Ta2O5). In some other non-limiting embodiment, the barrier layer 306 can be a silicon barrier layer.

Such graphene tunneling photodetectors should exhibit very low sensitivity to temperature, even at the elevated temperatures experienced in downhole environments because, whenever a tunneling energy barrier (e.g., 0.50 eV for the barrier height) is much greater than the average electron thermal energy (1/60 eV at 25 C room temperature to 1/35 eV at 232 C), then there should be little change in tunneling probability with temperature. As such, the quantum mechanical tunneling of electrons through the barrier will have little dependence on temperature. There are no known reports or suggestions in the literature of operating a graphene tunneling photodetector substantially above room temperature (e.g., at downhole temperatures). However, from quantum mechanics, the tunneling probability goes as:

$$\Psi = A e^{-\alpha x} \qquad \text{Eq. (1)}$$

where x is the width of the barrier and $$\alpha = \sqrt{\frac{2m(U_0 - E)}{\hbar^2}} \qquad \text{Eq. (2)}$$

where m is the mass of an electron, U is the height (0.50 eV) of the energy barrier, E is the energy of the electron (which, in the absence of photons, is just its thermal energy (by equipartition in a 2-dimensional graphene structure, E=(2/2)kT), $\hbar$ is Planck's constant, k is Boltzmann's constant, and T is the absolute temperature. For example, a photon of wavelength 1240 nm has an energy of 1 eV, a 620 nm photon has an energy of 2 eV, and an 2480 nm photon has an energy of 0.5 eV. Therefore, an electron that is struck by such a photon can gain much more energy than its inherent thermal energy, even at 232° C. (an example downhole temperature).

The low dependence upon temperature of a graphene tunneling photodetector can be illustrated by an example. A first graphene tunneling photodetector can be employed at room temperature (e.g., T=25° C. ($\Psi_{25}$)) and a second graphene tunneling photodetector can be employed at an example downhole temperature (e.g., T=232° C. ($\Psi_{232}$)). Using Eqs. (1)-(2), the following relationship can be found:

$$\frac{\Psi_{232}^2}{\Psi_{25}^2} = \left[\frac{\alpha_{232}}{\alpha_{25}}\right]^2 = 1.0265 \qquad \text{Eq. (3)}$$

and thus the ratio of electron tunneling at 232° C. to tunneling at 25° C. is 1.0265. Accordingly, the increase in electron tunneling probability from 25° C. to 232° C. is only 2.65%. From this, it can be seen that a graphene tunneling photodetector has little repercussion from exposure to high temperatures.

In addition to the temperature advantages provided by graphene tunneling photodetectors as provided herein, the graphene tunneling photodetectors also exhibit a high responsivity of about one ampere per watt of incident photon energy. Such responsivity is comparable to ordinary photodiodes at room temperature, corresponding to many nano-amperes or more for the light levels found in various applications.

Although described herein up to this point as a graphene tunneling photodetectors doing downhole spectroscopy, such photodetector sensor components can also (or additionally) be employed downhole with fiber optic sensors configured to measure and/or sense temperature, pressure, strain, acoustic waveforms, etc. as known in the art. Graphene tunneling photodetectors could also be used for downhole optical isolators or for fiber optic telemetry. Accordingly, the present disclosure is not intended to be limiting with respect to the graphene tunneling photodetectors, but rather is presented for example only.

Advantageously, embodiments provided herein enable high-temperature photodetectors and/or other types of downhole sensors that have excellent light sensitivity over a broad spectrum of light wavelengths for use in downhole fluid analyzers and/or with fiber optic sensors.

Figure 4:
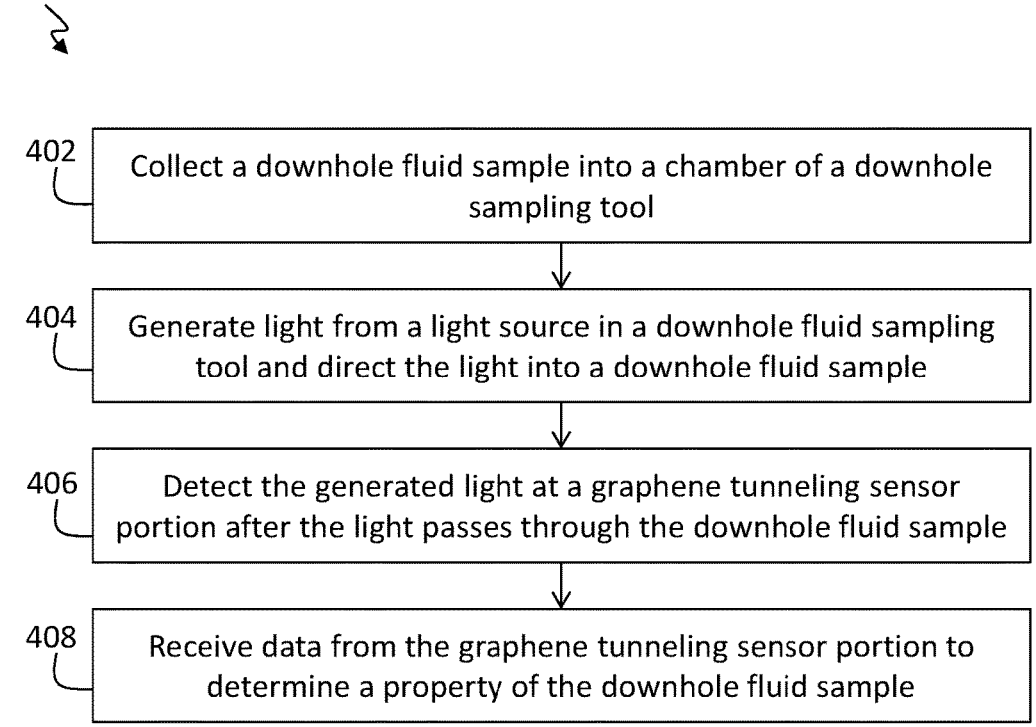
FIG. 4 is a flow process for estimating a property of a fluid downhole sample in accordance with an embodiment of the present disclosure.

Turning now to FIG. 4, a flow process for estimating a property of a fluid downhole is shown. The flow process 400 of FIG. 4 is one example application of using a graphene tunneling photodetector in accordance with the present disclosure, and various other applications are possible without departing from the scope of the present disclosure. For example, various other processes and/or methods can be carried out using graphene tunneling photodetectors as provided herein, including, but not limited to downhole fiber optic sensors for temperature, pressure, strain, acoustic waveforms, etc. as well as for downhole optical isolators and/or fiber optic telemetry.

The flow process 400 can be performed by one or more various downhole tools and/or sampling tools, such as described above. The flow process 400 is performed downhole at high temperatures within a downhole environment (e.g., around 232° C.). Accordingly, the flow process 400 can be performed by a downhole sampling tool that has been conveyed downhole, for example, on a drill string, wire line, or other carrier.

At block 402, with the downhole sampling tool located downhole, a downhole fluid sample can be collected by the sampling tool. The downhole fluid sample can be collected within a chamber or conduit within the downhole sampling tool. The chamber or conduit can have one or more optical windows that enables light to be directed into and through the downhole fluid sample within the chamber or conduit. At block 404, light can be generated by a light source of the sampling tool, with the light being directed toward, into, and through the downhole fluid sample. At block 406, the generated light that is passed through the downhole fluid sample can be received by and detected by a graphene tunneling sensor portion of the downhole sampling tool. At block 408, a processor or other component can receive data from the graphene tunneling sensor portion to estimate or otherwise determine one or more properties of the downhole fluid sample.

Those of skill in the art will appreciate that other processes and/or steps can be included within the flow process 400 and/or variations can be made thereon. For example, a modulating process may be performed with respect to the light prior to the light entering the chamber or conduit and interacting with the downhole fluid sample contained therein.

As provided herein, downhole sampling tools employing graphene tunneling sensors can be used to measure and/or detect various characteristics and/or properties of the downhole fluid sample. For example, non-limiting characteristics and/or properties of the downhole fluid sample can include a fluid viscosity, a presence of a gas in the downhole fluid sample, an amount of gas, and a presence of contamination in the downhole fluid sample.

Embodiment 1

A photodetector of a downhole tool for performing a downhole operation, the photodetector comprising: a housing configured along a carrier disposed downhole within a borehole; and a graphene tunneling photodetector located within the housing configured to perform a downhole operation.

Embodiment 2

A photodetector according to any of the preceding embodiments, wherein the downhole operation is at least one of measuring a temperature, measuring a pressure, measuring a strain, measuring an acoustic waveform, performing fiber optic telemetry, or operating as an optical isolator.

Embodiment 3

A photodetector according to any of the preceding embodiments, wherein the graphene tunneling photodetector comprises: a chamber configured to have a downhole fluid sample contained therein; a light source configured to illuminate the downhole fluid sample within the chamber; a graphene tunneling sensor portion in optical communication with the downhole fluid sample for sensing light that impinges the downhole fluid sample to estimate a property of the downhole fluid sample; and a processor configured to estimate the property of the downhole fluid sample from the graphene tunneling sensor portion.

Embodiment 4

A photodetector according to any of the preceding embodiments, wherein the graphene tunneling sensor portion comprises a first graphene layer, a second graphene layer, and a barrier layer disposed between the first graphene layer and the second graphene layer.

Embodiment 5

A photodetector according to any of the preceding embodiments, wherein the first graphene layer is a graphene film, the second graphene layer is a graphene film, and the barrier layer is a silicon layer.

Embodiment 6

A photodetector according to any of the preceding embodiments, wherein the second graphene layer is mounted on a substrate.

Embodiment 7

A photodetector according to any of the preceding embodiments, further comprising a light modulator configured between the light source and the chamber.

Embodiment 8

A photodetector according to any of the preceding embodiments, wherein the chamber is part of a conduit that fluidly connects the chamber with the borehole to enable extraction of the downhole fluid sample from the borehole.

Embodiment 9

A photodetector according to any of the preceding embodiments, wherein the chamber includes a first optical window positioned between the light source and the chamber, the first optical window configured to enable light from the light source to enter the chamber, and a second optical window positioned between the chamber and the graphene tunneling sensor portion, the second optical window configured to enable light to pass from the chamber to the graphene tunneling sensor portion.

Embodiment 10

A photodetector according to any of the preceding embodiments, further comprising one or more optical filters disposed between the chamber and the graphene tunneling sensor portion.

Embodiment 11

A photodetector according to any of the preceding embodiments, wherein the property comprises at least one of a fluid viscosity, a presence of a gas in the downhole fluid sample, an amount of gas, and a presence of contamination in the downhole fluid sample.

Embodiment 12

A method for performing a downhole operation using a photodetector, the method comprising: conveying a housing downhole along a carrier; and performing a downhole operation with a graphene tunneling photodetector.

Embodiment 13

The method of any of the preceding embodiments, wherein the downhole operation comprises at least one of measuring a temperature, measuring a pressure, measuring a strain, measuring an acoustic waveform, performing fiber optic telemetry, or operating as an optical isolator.

Embodiment 14

The method of any of the preceding embodiments, further comprising: collecting a downhole fluid sample into a fluid sampling tool; exposing the downhole fluid sample to a light generated by a light source of the fluid sampling tool; and using a graphene tunneling sensor to sense light that passes through the downhole fluid sample to estimate a property of the downhole fluid sample.

Embodiment 15

The method of any of the preceding embodiments, wherein the graphene tunneling sensor comprises a first graphene layer, a second graphene layer, and a barrier layer disposed between the first graphene layer and the second graphene layer.

Embodiment 16

The method of any of the preceding embodiments, further comprising receiving data from the graphene tunneling sensor at a processor configured to estimate the property of the downhole fluid sample.

Embodiment 17

The method of any of the preceding embodiments, further comprising applying a soft modeling technique to the light sensed by the graphene tunneling sensor to estimate at least one of a physical characteristic and a chemical characteristic of the downhole fluid sample.

Embodiment 18

The method of any of the preceding embodiments, further comprising modulating the light from the light source prior to exposing the downhole fluid sample to the light from the light source.

Embodiment 19

The method of any of the preceding embodiments, wherein the property comprises at least one of a fluid viscosity, a presence of a gas in the downhole fluid sample, an amount of gas, and a presence of contamination in the downhole fluid sample.

Embodiment 20

The method of any of the preceding embodiments, further comprising filtering the light after the light passes through the downhole fluid sample and prior to sensing of the light by the graphene tunneling sensor.

In support of the teachings herein, various analysis components may be used including a digital and/or an analog system. For example, controllers, computer processing systems, and/or geo-steering systems as provided herein and/or used with embodiments described herein may include digital and/or analog systems. The systems may have components such as processors, storage media, memory, inputs, outputs, communications links (e.g., wired, wireless, optical, or other), user interfaces, software programs, signal processors (e.g., digital or analog) and other such components (e.g., such as resistors, capacitors, inductors, and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (e.g., ROMs, RAMs), optical (e.g., CD-ROMs), or magnetic (e.g., disks, hard drives), or any other type that when executed causes a computer to implement the methods and/or processes described herein. These instructions may provide for equipment operation, control, data collection, analysis and other functions deemed relevant by a system designer, owner, user, or other such personnel, in addition to the functions described in this disclosure. Processed data, such as a result of an implemented method, may be transmitted as a signal via a processor output interface to a signal receiving device. The signal receiving device may be a display monitor or printer for presenting the result to a user. Alternatively or in addition, the signal receiving device may be memory or a storage medium. It will be appreciated that storing the result in memory or the storage medium may transform the memory or storage medium into a new state (i.e., containing the result) from a prior state (i.e., not containing the result). Further, in some embodiments, an alert signal may be transmitted from the processor to a user interface if the result exceeds a threshold value.

Furthermore, various other components may be included and called upon for providing for aspects of the teachings herein. For example, a sensor, transmitter, receiver, transceiver, antenna, controller, optical unit, electrical unit, and/or electromechanical unit may be included in support of the various aspects discussed herein or in support of other functions beyond this disclosure.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The flow diagram(s) depicted herein is just an example. There may be many variations to this diagram or the steps (or operations) described therein without departing from the scope of the present disclosure. For instance, the steps may be performed in a differing order, or steps may be added, deleted or modified. All of these variations are considered a part of the present disclosure.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the present disclosure.

The teachings of the present disclosure may be used in a variety of well operations. These operations may involve using one or more treatment agents to treat a formation, the fluids resident in a formation, a wellbore, and/or equipment in the wellbore, such as production tubing. The treatment agents may be in the form of liquids, gases, solids, semi-solids, and mixtures thereof. Illustrative treatment agents include, but are not limited to, fracturing fluids, acids, steam, water, brine, anti-corrosion agents, cement, permeability modifiers, drilling muds, emulsifiers, demulsifiers, tracers, flow improvers etc. Illustrative well operations include, but are not limited to, hydraulic fracturing, stimulation, tracer injection, cleaning, acidizing, steam injection, water flooding, cementing, etc.

While embodiments described herein have been described with reference to various embodiments, it will be understood that various changes may be made and equivalents may be substituted for elements thereof without departing from the scope of the present disclosure. In addition, many modifications will be appreciated to adapt a particular instrument, situation, or material to the teachings of the present disclosure without departing from the scope thereof. Therefore, it is intended that the disclosure not be limited to the particular embodiments disclosed as the best mode contemplated for carrying the described features, but that the present disclosure will include all embodiments falling within the scope of the appended claims.

Accordingly, embodiments of the present disclosure are not to be seen as limited by the foregoing description, but are only limited by the scope of the appended claims.

What is claimed is:

1. A downhole tool for performing downhole spectroscopy, the downhole tool comprising:
    a housing configured along a carrier disposed downhole within a borehole, wherein the housing is configured to fluidly separate an interior of the housing from a borehole area external to the housing when disposed downhole, the borehole having a downhole temperature of 125° C. or greater; and
    a graphene tunneling photodetector located within the housing configured to perform the downhole operation within the housing and at the downhole temperature, wherein the graphene tunneling photodetector is configured to be exposed to the downhole temperature during the downhole spectroscopy, the graphene tunneling photodetector comprising:
    a chamber configured to have a downhole fluid sample contained therein;
    a light source configured to illuminate the downhole fluid sample within the chamber, the light source configured to generate light at least one of near-infrared, mid-infrared, and far-infrared;
    a graphene tunneling sensor portion in optical communication with the downhole fluid sample for sensing light from the light source that impinges the downhole fluid sample to estimate a property of the downhole fluid sample; and
    a processor operably connected to the graphene tunneling sensor portion and configured to estimate the property of the downhole fluid sample based on a signal received at the graphene tunneling sensor portion.

2. The downhole tool according to claim 1, wherein the downhole spectroscopy is employed to at least one of measure a temperature, measure a pressure, measure a strain, and measure an acoustic waveform.

3. The downhole tool according to claim 1, wherein the graphene tunneling sensor portion comprises a first graphene layer, a second graphene layer, and a barrier layer disposed between the first graphene layer and the second graphene layer.

4. The downhole tool according to claim 3, wherein the first graphene layer is a graphene film, the second graphene layer is a graphene film, and the barrier layer is a silicon layer.

5. The downhole tool according to claim 3, wherein the second graphene layer is mounted on a substrate.

6. The downhole tool according to claim 1, further comprising a light modulator configured between the light source and the chamber.

7. The downhole tool according to claim 1, wherein the chamber is part of a conduit that fluidly connects the chamber with the borehole to enable extraction of the downhole fluid sample from the borehole.

8. The downhole tool according to claim 1, wherein the chamber includes a first optical window positioned between the light source and the chamber, the first optical window configured to enable light from the light source to enter the chamber, and a second optical window positioned between the chamber and the graphene tunneling sensor portion, the second optical window configured to enable light to pass from the chamber to the graphene tunneling sensor portion.

9. The downhole tool according to claim 1, further comprising one or more optical filters disposed between the chamber and the graphene tunneling sensor portion.

10. The downhole tool according to claim 1, wherein the property of the fluid sample comprises at least one of a fluid viscosity, a presence of a gas in the downhole fluid sample, an amount of gas, and a presence of contamination in the downhole fluid sample.

11. A method for performing downhole spectroscopy, the method comprising:
    conveying a downhole tool having a housing downhole along a carrier, wherein the housing fluidly separates an interior of the housing from a borehole area external to the housing, the borehole having a downhole temperature of 125° C. or greater, the downhole tool further having a graphene tunneling photodetector located within the housing configured to perform the downhole spectroscopy within the housing and at the downhole temperature; and
    performing the spectroscopy operation with the graphene tunneling photodetector, wherein the graphene tunneling photodetector is exposed to the downhole temperature during the spectroscopy operation,
    wherein the spectroscopy operation comprises:
    collecting a downhole fluid sample into the interior of the downhole tool;
    generating at least one of near infrared, raid-infrared, and far infrared with a light source;
    exposing the downhole fluid sample to the at least one of near infrared, mid-infrared, and far infrared generated by the light source; and
    using a graphene tunneling sensor to sense light that passes through the downhole fluid sample to estimate a property of the downhole fluid.

12. The method of claim 11, wherein the downhole spectroscopy comprises at least one of measuring a temperature, measuring a pressure, measuring a strain, and measuring an acoustic waveform.

13. The method according to claim 11, wherein the graphene tunneling sensor comprises a first graphene layer, a second graphene layer, and a barrier layer disposed between the first graphene layer and the second graphene layer.

14. The method according to claim 11, further comprising receiving data from the graphene tunneling sensor at a processor configured to estimate the property of the downhole fluid sample.

15. The method according to claim 11, further comprising applying a soft modeling technique to the light sensed by the graphene tunneling sensor to estimate at least one of a physical characteristic and a chemical characteristic of the downhole fluid sample.

16. The method according to claim 11, further comprising modulating the light from the light source prior to exposing the downhole fluid sample to the light from the light source.

17. The method according to claim 11, wherein the property comprises at least one of a fluid viscosity, a presence of a gas in the downhole fluid sample, an amount of gas, and a presence of contamination in the downhole fluid sample.

18. The method according to claim 11, further comprising filtering the light after the light passes through the downhole fluid sample and prior to sensing of the light by the graphene tunneling sensor.

* * * * *